United States Patent [19]

Harada et al.

[11] Patent Number: 4,888,629
[45] Date of Patent: Dec. 19, 1989

[54] SUPERCONDUCTING DEVICE

[75] Inventors: Yutaka Harada, Kodaira; Shinichiro Yano, Hachioji; Mutsuko Miyake, Urawa; Ushio Kawabe, Nishitama; Toshikazu Nishino, Kawasaki, all of Japan

[73] Assignee: Hitachi, Ltd., Tokyo, Japan

[21] Appl. No.: 201,332

[22] Filed: May 31, 1988

Related U.S. Application Data

[63] Continuation of Ser. No. 724,764, Apr. 18, 1985.

[30] Foreign Application Priority Data

Apr. 19, 1984 [JP] Japan .................................. 59-77563
Sep. 21, 1984 [JP] Japan ................................ 59-196830

[51] Int. Cl.$^4$ ............................................. H01L 39/22
[52] U.S. Cl. ............................................ 357/5; 357/2; 357/4; 357/22; 357/23.1; 357/23.7; 357/59; 357/55

[58] Field of Search ...................... 357/2, 4, 5, 22, 234, 357/55, 59

[56] References Cited

U.S. PATENT DOCUMENTS 4,396,930 8/1983 Mizutani .......................... 357/59 E
4,589,001 5/1986 Sakai et al. .............................. 357/5

Primary Examiner—Edward J. Wojciechowicz
Attorney, Agent, or Firm—Antonelli, Terry & Wands

[57] ABSTRACT

Superconducting electrodes are formed on a semiconductor which serves as a channel. A control electrode is disposed through an insulator film or a p-n junction on the side of the semiconductor which is opposite to the semiconductor side on which the superconducting electrode is formed. A superconducting current which flows between the superconducting electrodes across the semiconductor is controlled by an electric signal which is applied to the control electrode, thereby enhancing the current gain.

21 Claims, 7 Drawing Sheets

SUPERCONDUCTING DEVICE

This application is a continuation of application Ser. No. 724,764, filed on Apr. 18, 1985.

BACKGROUND OF THE INVENTION

The present invention relates to a superconducting device which operates at a cryogenic temperature, and more particularly to a superconducting switching device in which the numbers of superconducting and normal conducting electrons which tunnel through a semiconductor are controlled by a voltage applied to a control electrode.

As a superconducting device in which a semiconductor and a superconductor are combined, there has been known a hydrid Josephson field effect transistor (JOFET) proposed by T. D. Clark et al, (J. Appl. Phys. 51(5) 2736-2743 (1980)). The JOFET has a structure in which the semiconductor (normal conductor) and the superconductor are joined. Electron pairs or Cooper pairs in the superconductor leak into the semiconductor by a depth corresponding to a coherence length. It is the principle of the JOFET that the Cooper pairs having leaked into the semiconductor are moved in the direction within the plane of the semiconductor. Since, in this JOFET, the Cooper pairs are supplied from a gate electrode, the current gain cannot exceed 1 (one). Therefore, the circuit gain is disadvantageously small.

As other superconducting devices in which a semiconductor and a superconductor are combined, there have been ones disclosed in Japanese patent application Laying-open No. 57-176781 and No. 57-106186. The device of the former uses a semiconductor material which can fall into a superconducting state at a temperature below a superconducting transition temperature $T_c$. $T_c$ in this case is, in general, nearly equal to or lower than the temperature of liquid He (4.2 K). In order to stably operate a circuit, therefore, the device needs to be cooled below 4.2 K. The device of the latter has a structure in which a control electrode is disposed in the narrow space between superconducting electrodes, so that the fabrication of the control electrode is difficult.

SUMMARY OF THE INVENTION

An object of the present invention is to solve the problems as mentioned above, and to provide a novel superconducting switching device whose characteristics can be controlled by a voltage and whose current gain is great.

The present invention for accomplishing this object is characterized in that superconducting electrodes are disposed on one side of a semiconductor, while an electrode for controlling a superconducting current to flow through the semiconductor is disposed on the other side of the semiconductor.

Mentioned as an example of this construction of the present invention is one in which two superconducting electrodes are disposed on the upper side of a semiconductor, while an electrode for controlling a superconducting current to flow between the superconducting electrodes across the semiconductor is disposed on the lower side of the semiconductor. In order to prevent the current through the semiconductor from flowing into the control electrode, an insulator film is interposed between the control electrode and the semiconductor, or the control electrode and the semiconductor are joined into a p-n junction.

As another example of the construction of the present invention, at least one superconducting electrode is disposed between a source electrode and a drain electrode, and the number of Cooper pairs having leaked from the superconducting electrode into a semiconductor is controlled by a control electrode disposed on the lower side of the semiconductor, whereby a superconducting current which flows between the source electrode and the drain electrode is controlled.

In the case of forming the two superconducting electrodes on the upper side of the semiconductor, it is necessary for the device to operate so that the two superconducting electrodes are disposed at a distance at which they form a superconducting weak link. It has been revealed that, in case of employing Si as the semiconductor, the spacing between the superconducting electrodes must be at most 300 nm. In this case, although difficulty in fabrication is involved, a superconducting switching device of great current gain can also be constructed by forming the control electrode on the same side as that of the superconducting electrodes.

DESCRIPTION OF THE PREFERRED EMBODIMENTS

Figure 1:
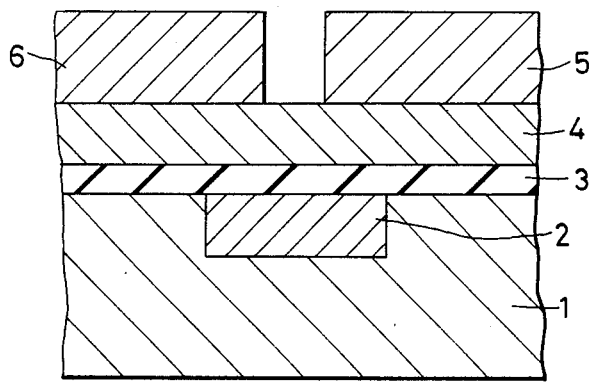
FIGS. 1, 3 and 4 are sectional views each showing part of a superconducting device according to an embodiment of the present invention.

FIG. 1 shows the first embodiment of the present invention. An impurity B was introduced by $10^{18}-10^{20}$ cm$^{-3}$ into a substrate 1 made of n-type Si and having an impurity concentration of at most $10^{15}$ cm$^{-3}$, to form a p-type control electrode 2 having a depth of 1-2 μm. The substrate 1 should desirably be of a material which becomes semi-insulating at a cryogenic temperature in this manner. Next, the front surface of the substrate 1 was oxidized to form an insulator film 3 made of SiO$_2$ approximately 30 nm thick. Subsequently, a semiconductor layer 4 made of Si approximately 100 nm thick was formed by vapor deposition or molecular beam epitaxy. The object of the present invention could be achieved in both the cases where the semiconductor layer 4 was in an amorphous state and a polycrystalline state. An n-type impurity (As or P) was introduced into the semiconductor layer 4 at a concentration of $5\times10^{19}-10^{20}$ cm$^{-3}$. Subsequently, first and second superconducting electrodes 5 and 6 in the shape of belts each having a width of approximately 5 μm were formed on the identical side of the substrate 1. A material to make the superconducting electrodes should desirably be selected from among Pb, alloys containing Pb as their principal ingredients, Nb, and Nb compounds, in order to permit the device to operate in liquid He, but these materials are not restrictive. In the way described above, the superconducting device of the present invention could be fabricated.

In this device, the superconducting electrodes 5 and 6 are coupled by superconducting weak link when the device is cooled to or below the transition temperature of the superconducting electrode material, so that the maximum Josephson current $I_m$ to flow across the two superconducting electrodes is given by the following equation:

$$, B, 90, 66 I_m = 4\pi \Delta/2 \, e \, R_N \qquad \ldots (1)$$

Here, $\Delta$ denotes the gap energy of the superconducting electrodes 5 and 6, e the elementary charge, and $R_N$ the normal tunneling resistance of the superconducting weak link. The spacing between the two superconducting electrodes 5 and 6 is selected to be 300 nm or less in order to form the superconducting weak link, and both the electrodes should desirably be spatially separated.

In a case where a voltage negative with respect to the superconducting electrode 5 or 6 is applied to the control electrode 2, positive charges are induced on the side of the semiconductor layer 4 at the interface between this semiconductor layer 4 and the insulator film 3. On account of the charges, a state as a tunnel barrier changes, and $R_N$ changes to a larger value, so that the maximum Josephson current $I_m$ which can be caused to flow without generating any voltage across the electrodes 5 and 6 decreases. That is, the embodiment is characterized in that the semiconductor is used as a tunneling barrier layer to superconducting tunneling and that the voltage applied to the control electrode disposed on the semiconductor through the insulator film approximately 10—30 nm thick is used for changing the quantity of space charges within the semiconductor so as to change the width and height of the tunnel barrier (a barrier to the tunneling of Cooper pairs through the semiconductor portion), thereby to operate the device. Accordingly, the semiconductor need not be used at a temperature below the superconducting transition temperature thereof. In addition, since the control electrode is not used for the supply of the Cooper pairs, the gain as the device can be rendered high.

Figure 2:
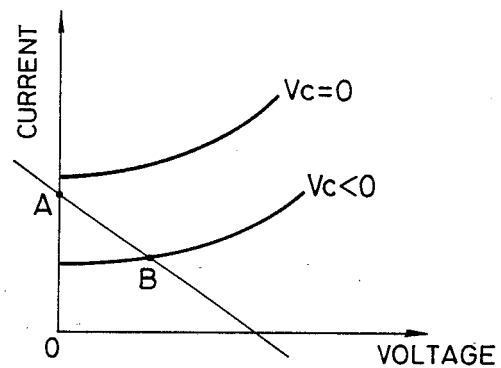
FIG. 2 is a diagram for explaining the characteristics of the superconducting device according to the first embodiment of the present invention shown in FIG. 1.

FIG. 2 is an explanatory diagram of the characteristics of such superconducting device according to Embodiment 1. In a case where a load is set as in this figure, an operating point which has been a point A when the voltage $V_c$ of the control electrode 2 is 0 (zero) is switched to a point B by the application of a signal of a gate voltage $V_G < 0$. Since, on this occasion, the control electrode 2 is separated from the semiconductor layer 4 by the insulator film 3, this device performs the operation of the voltage-controlled type. While the embodiment shown in FIG. 1 has employed the control electrode 2 of the p-type semiconductor and the semiconductor layer 4 of the n-type, these may well be replaced with a control electrode 2 of an n-type semiconductor and a semiconductor layer 4 of the p-type. Besides, the material of the semiconductor layer 4 may well be any of Ge, GaAs, InAs, InP, InSb etc. otherwise than Si. As the material of the insulator film 3, even when a thin film of SiO or Si$_3$N$_4$ was used, similar effects could be attained. In this case, a carrier concentration of at least $6 \times 10^{18}$ cm$^{-3}$ for Ge, a carrier concentration of at least $1 \times 10^{17}$ cm$^{-3}$ for GaAs or InP, and a carrier concentration of at least $1 \times 10^{16}$ cm$^{-3}$ for InAs or InSb are desirable for the device to operate at the cryogenic temperature. However, even when the carrier concentration was below the numerical value mentioned here, the object of the present invention could be achieved by enlarging the voltage to be applied to the control electrode.

Although, in the present embodiment, the n-type semiconductor was employed for the substrate 1 and the p-type semiconductor material for the semiconductor layer 4, similar effects could be attained even in a case where a p-type semiconductor was employed for the substrate 1 and an n-type semiconductor for the semiconductor layer 4 and where a positive voltage was applied to the control electrode 2.

Band diagrams of the interspace between the first and second superconducting electrodes of the superconducting device shown in FIG. 1 are shown in FIGS. 5, 6, 7 and 8.

In each of the figures, numeral 7 designates the conduction band of the first superconducting electrode, numeral 8 the forbidden band of the first superconducting electrode, numeral 9 the valence band of the first superconducting electrode, numeral 10 the conduction band of the second superconducting electrode, numeral 11 the forbidden band of the second superconducting electrode, and numeral 12 the valence band of the second superconducting electrode.

Figure 5:
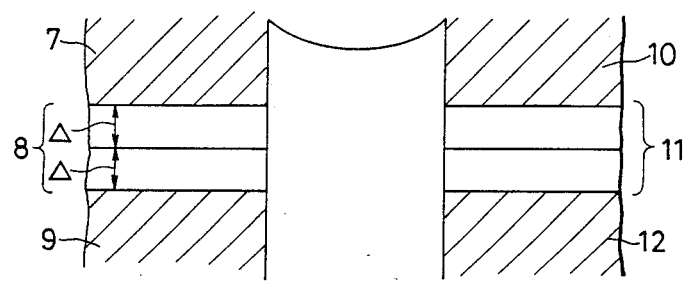
FIGS. 5-8 are diagrams each showing the band state of the superconducting device according to the first embodiment of the present invention.
Figure 6:
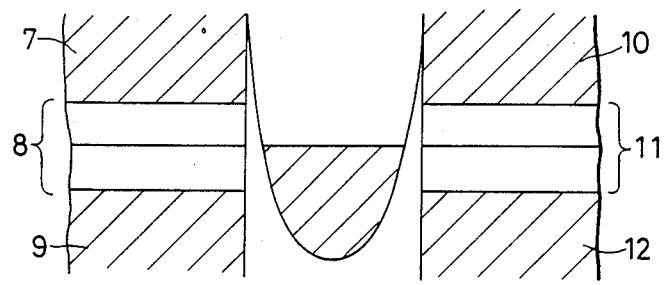
Figure 7:
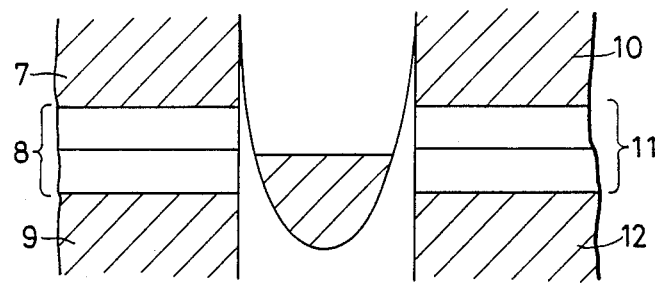
Figure 8:
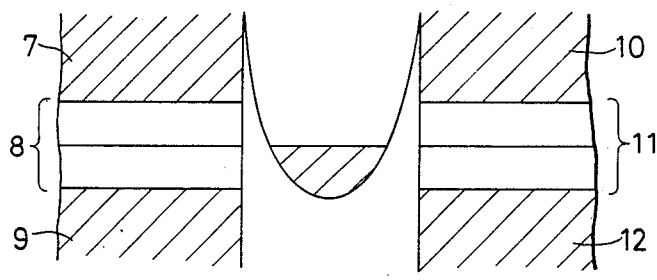

FIG. 5 corresponds to a case of employing a nondegenerate material for the semiconductor, while FIG. 6 a case of employing a degenerate semiconductor as the semiconductor, and no voltage is applied to the control electrode in each case. The band diagram in the case of applying a voltage to the control electrode becomes as shown in FIG. 7 in the case of the nondegenerate semiconductor, and as shown in FIG. 8 in the case of the degenerate semiconductor. In the former, the superconducting critical current increases to perform switching, whereas in the latter, it decreases to perform the same.

Figure 3:
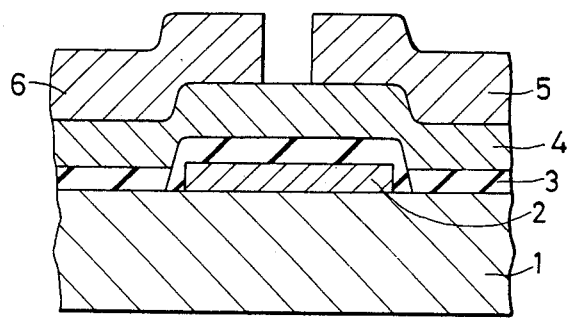

FIG. 3 shows the second embodiment of the present invention. A control electrode 2 was formed in such a way that Nb being a superconducting metal was fabricated into a film approximately 200 nm thick by a sputtering technique employing Ar gas, whereupon the film was processed by a reactive ion etching technique employing CF$_4$ gas. Subsequently, on the surface of the resultant structure, an amorphous SiO$_2$ film approximately 50 nm thick was deposited by CVD to form an insulator film 3. Next, using the RF discharge of silane gas, an amorphous silicon film which contained P at a high concentration of at least $10^{19}$ cm$^{-3}$ and which was approximately 200 nm thick was formed into a semiconductor layer 4. Lastly, superconducting electrodes 5 and 6 made of Nb and approximately 300 nm thick were formed by sputtering and processed by reactive ion etching. In this embodiment, the structure itself of the superconducting device is the same as in the first embodiment, but the superconducting metal is used for the control electrode 2. Although the native oxide film of this superconducting metal should desirably used as the insulator film 3, a thin film of SiO$_2$, SiO, Si$_3$N$_4$ or the like may well be deposited and used. The superconducting metal should desirably be at least one material selected from among Nb, compounds of Nb, and Ta so as to increase the relative dielectric constant of the insulator film 3, but the materials are not restrictive. Thus, the operating voltage of the device can be rendered low, and the power consumption can be reduced.

Figure 4:
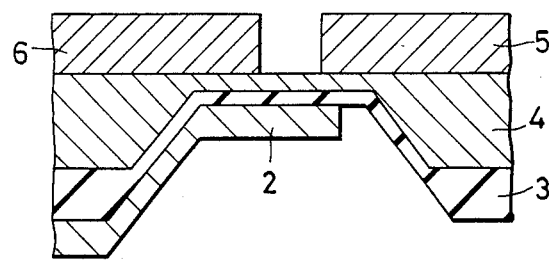

FIG. 4 shows the third embodiment of the present invention. In this embodiment, a Si single crystal is used for a semiconductor layer 4. The Si single crystal is of the p-type or the n-type, and should desirably have an impurity concentration of at most $1 \times 10^{19}$ cm$^{-3}$.

More specifically, the Si single crystal of (100) orientation was processed as shown in FIG. 4 by anisotropic etching with KOH and using SiO$_2$ or the like as a mask, to form the very thin semiconductor layer 4 which was approximately 100-200 nm thick. The surface of the semiconductor layer 4 was oxidized to form an insulator film 3. Used as a control electrode 2 was Pb being a superconducting metal which was deposited to approximately 500 nm by vapor deposition and was thereafter processed. Subsequently, the upper surface of the semiconductor layer 4 was cleaned, and superconducting electrodes 5 and 6 made of Nb or Pb and approximately 300 nm thick were formed by preparing a film and processing it with the reactive ion etching. Even with such a structure, effects similar to those of the first embodiment could be attained.

While, in the above embodiments, the semiconductor layer 4 (which may well be a semiconductor body) between the first and second superconducting electrodes 5 and 6 was underlaid with the control electrode 2 through the insulator film 3, similar effects can be attained even when the semiconductor layer 4 between the first and second superconducting electrodes 5 and 6 is overlaid with a control electrode 2 through an insulator film 3. More specifically, although difficulty is involved in disposing the control electrode in the narrow inter-electrode space through the insulator film, a superconducting device having similar characteristics can be produced when the superconducting electrodes are formed at an inter-electrode distance required for the operation of the superconducting device, the distance having been first revealed by the inventor. In case of using Si as the semiconductor, this distance is at most 300 nm, and a value of about 200 nm is preferable when the applied voltage of the control electrode, etc. are taken into consideration.

The superconducting device fabricated in the above way has a small static capacitance existing in parallel with the superconducting weak link, so that the hystereses of characteristics are very slight, and a D.C. power system can be used in place of an A.C. power system which hampers the enhancement of the speed of a conventional Josephson circuit and the simplification of the circuit. Moreover, even in case of a device which is of the voltage-controlled type and which uses a semiconductor, since the tunnel effect is utilized, the high frequency response is not limited by the mobility of semiconductor carriers, and high speed switching can be realized.

Figure 9:
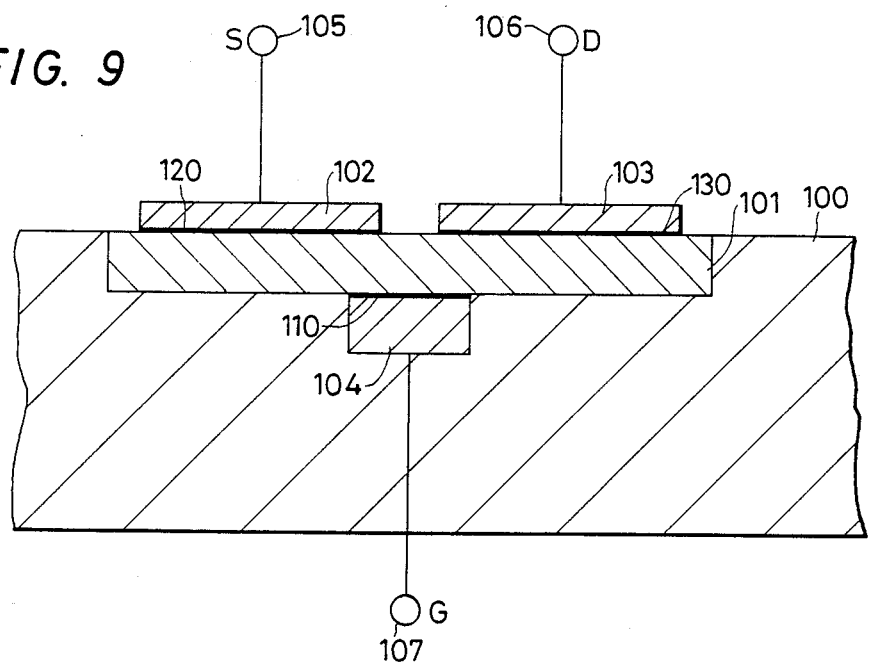
FIG. 9 is a view showing a fourth embodiment of the present invention.

Next, FIG. 9 shows the fourth embodiment of the present invention. A silicon substrate 100 having an impurity concentration of 10$^{15}$ cm$^{-3}$ is formed with a p-type buried electrode 104, and is also formed with an n-type channel layer 101 having a depth of 0.1–0.15 μm by introducing an impurity (As or P) by 10$^{18}$–10$^{20}$ cm$^{-3}$. The p-type buried electrode 104 and the n-type channel layer 101 lie in contact through a p-n junction 110. First and second superconducting electrodes 102 and 103 formed by vapor deposition are disposed at end parts of the n-type channel layer 101, and first and second junctions 120 and 130 are interposed between these electrodes and the n-type channel layer 101. The spacing L between the two superconducting electrodes 102 and 103 are small (300 nm) as in the first embodiment, and the two electrodes form superconducting weak link. The first and second junctions 120 and 130 construct Schottky barriers, which are very thin so that electrons can pass therethrough by tunneling phenomena. The p-type buried electrode 104 is connected to a gate terminal 107, and the first and second superconducting electrodes 102 and 103 are respectively connected to a source terminal 105 and a drain terminal 106.

Figure 10:
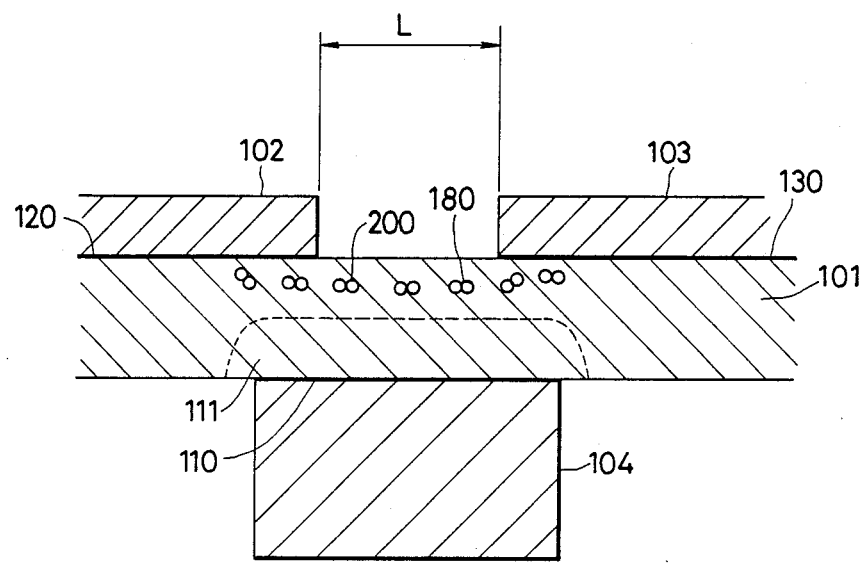
FIG. 10 is a diagram for explaining the operation of the fourth embodiment.

The operation of the switching device shown in FIG. 9 having such arrangement will be described with reference to FIG. 10. The n-type channel layer 101 is supplied with Cooper pairs 200 through the first Schottky junction 120 from the first superconducting electrode 102. Likewise, the n-type channel layer 101 is supplied with Cooper pairs 180 through the second Schottky junction 130 from the second superconducting electrode 103. As stated before, the spacing L between the two superconducting electrodes is as very small as 300 nm by way of example, and the two superconducting electrodes are weakly linked, so that a superconducting current flows across them. The maximum superconducting current $I_m$ which can flow between the two electrodes across the semiconductor is expressed by Eq. (1) mentioned before. The normal tunneling resistance $R_N$ is controlled by a voltage which is applied to the p-type buried electrode 104. As described before, the p-type buried electrode 104 and the n-type channel layer 101 lie in contact through the p-n junction 110. A depletion layer 111 is spread in the n-type channel layer 101 by the p-n junction 110, and the thickness of this depletion layer 111 changes depending upon the voltage applied to the p-type buried electrode 104. For example, when a reverse bias voltage applied to the p-n junction 110 is increased, the thickness of the depletion layer 111 increases. In consequence, the effective thickness of the n-type channel layer 101 decreases, and the normal conducting resistance $R_N$ of the n-type channel layer 101 increases. As apparent from Eq. (1), therefore, the maximum superconducting current to flow between the two superconducting electrodes 102 and 103 across the semiconductor decreases. It is obvious from the above description that the maximum superconducting current allowed to flow between the two superconducting electrodes 102 and 103 across the semiconductor can be controlled by the voltage applied to the p-type buried electrode 104.

According to the present embodiment, the p-type buried electrode 104 being a gate is isolated from the n-type channel layer 101 by the p-n junction 110. Therefore, any signal current does not flow to the p-type buried electrode 104 being the gate, and the device shown in FIG. 9 is a device which is driven by a voltage in regard to an input signal. While the embodiment shown in FIG. 9 uses the combination between the p-type buried electrode and the n-type channel layer, it is needless to say that the present invention can also be performed with the combination between an n-type buried electrode and a p-type channel layer.

Figure 11:
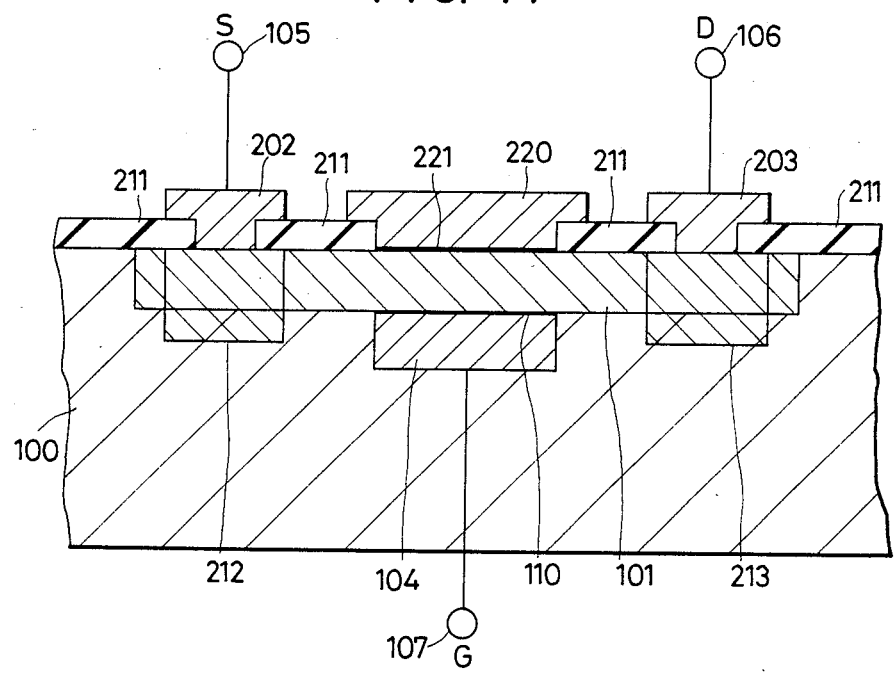
FIG. 11 is a view showing a fifth embodiment of the present invention.

FIG. 11 shows the fifth embodiment of the present invention. As in the fourth embodiment, a silicon substrate 100 is formed with a p-type buried electrode 104 and an n-type channel layer 101. The p-type buried electrode 104 and the n-type channel layer 101 lie in contact through a p-n junction 110. A superconducting electrode 220, which is formed by vapor deposition and which is 0.2–1 μm thick, lies in contact with the front surface of the n-type channel layer 101 through a Schottky barrier 221. Both the end parts of the n-type channel layer 101 lie in ohmic contact with first and second electrodes 202 and 203 through n-type contact layers 212 and 213 having an impurity concentration of $10^{20}10^{21}$ cm$^{-3}$. The respective electrodes are isolated by insulator layers 211 (for example, SiO layers or SiO$_2$ layers) so as not to lie in contact with the Si substrate 100 or the channel layer 101. The p-type buried electrode 104 is connected to a gate terminal 107, and the first and second electrodes 202 and 203 are respectively connected to a source terminal 105 and a drain terminal 106.

Figure 12:
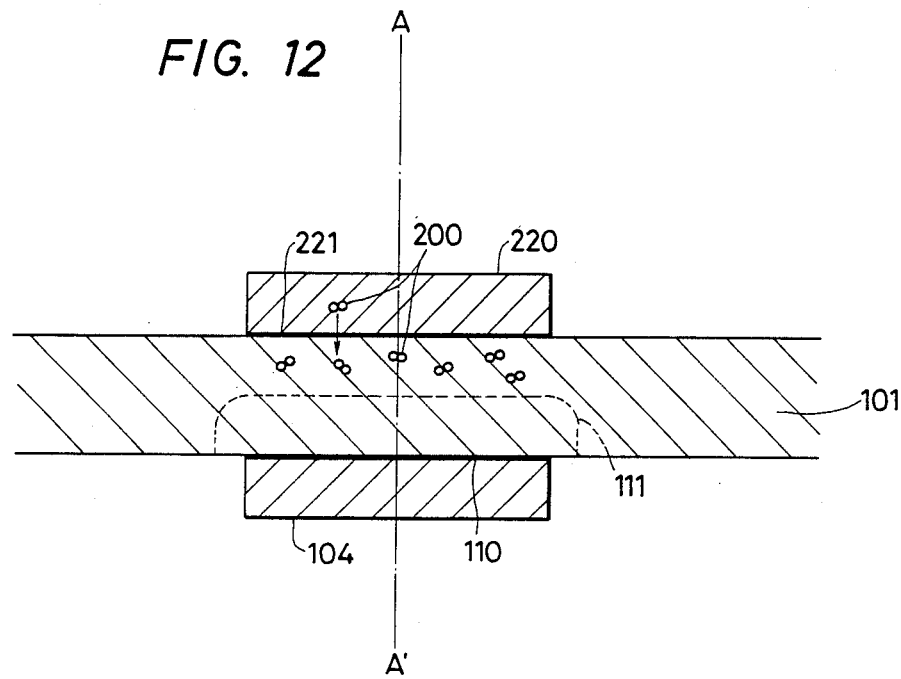
FIG. 12 is a diagram for explaining the operation of the fifth embodiment.

The operation of the switching device shown in FIG. 11 will be described with reference to FIG. 12. Cooper pairs 200 leak from the superconducting electrode 220 into the n-type channel layer 101 through the Schottky barrier 221. The Cooper pairs 200 spread within the semiconductor to a depth corresponding to a coherence length (1–0.1 μm), and they move in the lateral direction of the semiconductor, so that a superconducting current flows between the two electrodes 202 and 203. The maximum superconducting current which flows through the n-type channel layer 101 is expressed by Eq. (1) mentioned before. The normal conducting resistance $R_N$ of the n-type channel layer 101 can be controlled by a voltage which is applied to the p-type buried layer 104. The operating principle is similar to that explained in the fourth embodiment.

Figure 13:
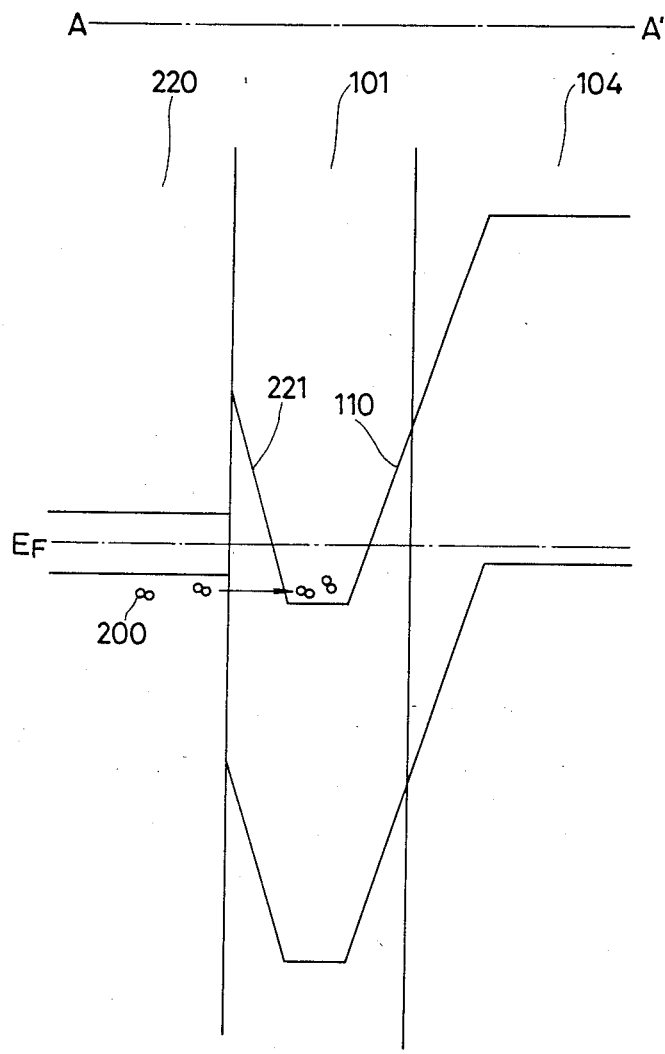
FIGS. 13 and 14 are energy band structure diagrams of the device of the fifth embodiment.
Figure 14:
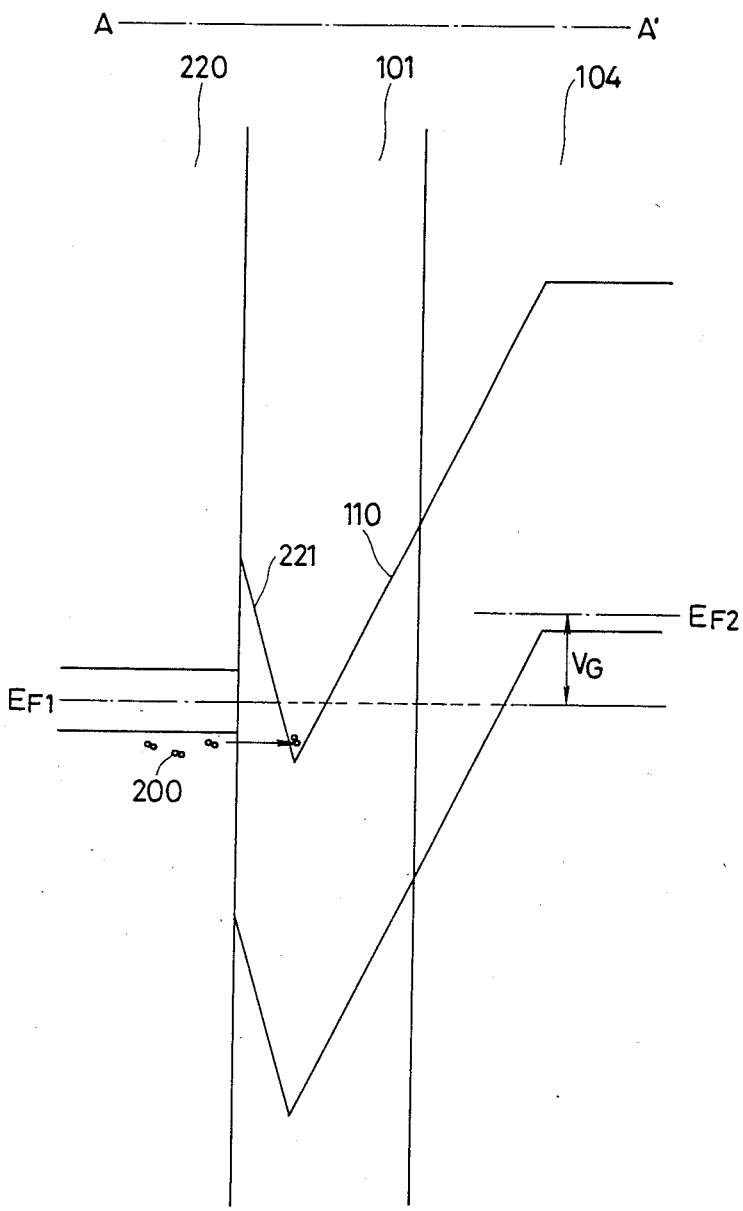

The operation of the embodiment shown in FIG. 11 will be described from the viewpoint of energy band structures with reference to FIGS. 13 and 14. FIGS. 13 and 14 are diagrams showing the energy band structures at a position A—A' in FIG. 12, and FIG. 13 corresponds to a case of applying no voltage to the p-type buried electrode 104, while FIG. 14 a case of applying a voltage to the p-type buried electrode 104 so as to reverse-bias the p-n junction 110. In the case of FIG. 13 where no voltage is applied, the Fermi levels $E_F$ of the superconducting electrode 220, n-type channel layer 101 and p-type buried electrode 104 are in agreement. Since the n-type channel layer 101 is doped with an impurity at a high concentration on the order of $10^{19}$ cm$^{-3}$, the Fermi level of the n-type channel layer 101 is 100–200 mV above the lower end of the conduction band. The Schottky barrier 221 is as very thin as 10–20 Å, and electrons can pass therethrough freely. Therefore, the Cooper pairs 200 of the superconducting electrode 220 pass through the Schottky barrier 221 to leak into the n-type channel layer 101. In the n-type channel layer 101, the valley of energy is formed by the Schottky barrier 221 and the p-n junction 110. The Cooper pairs 200 leaked into the n-type channel layer 101 are stored in this valley of energy. The stored Cooper pairs move laterally of the semiconductor, and become the superconducting current.

On the other hand, when a reverse bias voltage is applied to the p-type buried electrode 104 as illustrated in FIG. 14, the thickness of the depletion layer of the p-n junction 110 increases, and the valley of energy to store the Cooper pairs becomes small. Consequently, the quantity of the stored Cooper pairs lessens, and the maximum superconducting current decreases. It is obvious from the above description that the maximum superconducting current allowed to flow across the two electrodes 202 and 203 can be controlled by the voltage which is applied to the p-type buried electrode 104.

According to the present embodiment, the p-type buried electrode 104 being a gate is isolated from the n-type channel layer 101 by the p-n junction 110. Therefore, any input current does not flow to the p-type buried electrode 104 being the gate, and the device shown in FIG. 11 is obviously a device which is driven by a voltage in regard to the input signal.

While the embodiment shown in FIG. 11 uses the combination between the p-type buried electrode and the n-type channel layer, it is needless to say that the present invention can also be performed with the combination between an n-type buried electrode and a p-type channel layer.

Further, in the above embodiment, the quantity of the Cooper pairs to leak into the n-type channel layer 101 is changed by changing the potential of the superconducting electrode 220. Therefore, the superconducting electrode 220 can also be used as the offset electrode of the switching device.

While Si has been used for the substrate in the above two embodiments, Ge, GaAs, InSb, InAs or the like may well be employed. The element or compound of Pb, Nb or In can be used as the material of the superconducting electrode.

The voltage to be applied to the gate or the source or drain is, for example, 0–10 mV, and the current to flow is, for example, 100 μA for a gate width of 10 μm.

There will now be explained the reason why the voltage gain is enhanced in the present invention. In the prior-art device proposed by Clark, Cooper pairs are supplied from a gate electrode to a channel, and the supplied Cooper pairs move within the channel. From the viewpoint of a circuit, this operation is as stated below. When an input signal voltage changes, an input signal current corresponding to the change flows into the channel, and it flows into a drain electrode. That is, the same quantity of current as the input signal is obtained as an output current. This signifies that the input impedance of the circuit is small. With this circuit, obviously the gain of the circuit, especially the current gain thereof cannot be rendered high. On the other hand, in the device according to the present invention, Cooper pairs are supplied from an electrode different from the gate electrode. The gate electrode and the channel are insulated by, for example, the p-n junction. Therefore, even when the input signal voltage changes, no current flows into the gate electrode. From the viewpoint of a circuit, the device according to the present invention is a device of high input impedance wherein the gate electrode is insulated and wherein no input current flows even when the input voltage changes. Accordingly, in the circuit employing the device of the present invention, particularly the current gain can be enlarged, and in turn, the voltage gain can be enlarged.

Figure 15:
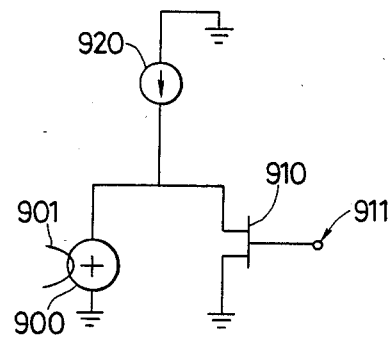
FIG. 15 is a circuit diagram showing an example in which a superconducting switching device according to the present invention and a Josephson junction device are used in coexistent fashion.

Meanwhile, the superconducting switching device according to the present invention can be used in coexistence with other superconducting switching devices, for example, Quiteron and Josephson junction devices and with superconducting strip lines (including superconducting transmission lines). The superconducting strip line is indispensable to a high speed circuit of small signal voltage amplitude because any voltage drop attributed to current flowing through the strip line is not involved. This is not available with conventional semiconductor technologies represented by a silicon semiconductor. The Josephson junction device is a switching device of the highest speed. The superconducting switching device according to the present invention can be operated in coexistence with the Josephson junction device, and can more bring out the performance of the Josephson junction device. FIG. 15 shows an example in which the superconducting switching device according to the present invention and the Josephson junction device are used in coexistence. The Josephson junction device is described in detail in "Josephson Computer Technology" IBM R & D, vol. 124, No. 2 (1980) by Anacker et al. The example of FIG. 15 is so arranged that a low current source 920 is connected to a circuit in which a Josephson junction device 900 and a superconducting switching device 910 according to the present invention are connected in parallel. Under a voltage state, the Josephson junction device operates in the so-called latching mode in which it does not shift into a superconducting state unless current to flow therethrough is rendered below a fixed magnitude. Heretofore, there has been proposed a circuit of the so-called A.C. power system in which a supply voltage is dropped in order to shift the Josephson junction device under the voltage state into the superconducting state. In the circuit of this system, the frequency of an A.C. power supply serves as a clock frequency. With the A.C. power supply of high frequency, a high speed operation has been limited because of large quantities of crosstalk noise between circuits. The circuit shown in FIG. 15 is a switching circuit adapted to be driven by a D.C. power supply, which is based on the principle that in order to shift the Josephson junction device 900 from the voltage state into the superconducting state, the superconducting switching circuit according to the present invention connected in parallel therewith is switched.

Now, the operation of the circuit shown in FIG. 15 will be described. When the Josephson junction device 900 is in the superconducting state, all the current of the low current source 920 flows into the Josephson junction device 900. Under this condition, current is caused to flow through the input line 901 of the Josephson junction device 900 so as to shift this Josephson junction device into the voltage state. When the voltage of the input terminal 911 of the superconducting switching device 910 according to the present invention is raised under the voltage state of the Josephson junction device, current flows into the superconducting switching device 910, and the current having flowed through the Josephson junction device 900 decreases, so that the Josephson junction device 900 shifts into the superconducting state. Since the circuit of FIG. 15 is driven by the D.C. power source and does not use the A.C. power source having been problematic in the conventional Josephson technology, it is capable of operating a system at high speed. It is obvious from the example of FIG. 15 that the superconducting device according to the present invention and the Josephson junction device can coexist to arrange a circuit and that the performance of the Josephson junction device can be sufficiently brought out.

We claim:

1. A superconducting device comprising:
a semiconductor body;
a pair of superconducting electrodes formed on one first surface of said semiconductor body to be separated from one another on said first surface, said superconducting electrodes being coupled by a superconducting weak link through said semiconductor body; and
means for controlling superconducting current flowing through said semiconductor body between said superconducting electrodes, wherein said controlling means is formed adjacent to another second surface of said semiconductor body between said superconducting electrodes which is substantially plane, and wherein said controlling means is insulated from said semiconductor body so as to prevent said superconducting current flowing through said semiconductor body from flowing into said controlling means.

2. A superconducting device according to claim 1, wherein said controlling means comprises a control electrode formed to be separated from said second surface of said semiconductor body by an insulating film.

3. A superconducting device according to claim 1, wherein said two superconducting electrodes are separated from one another on said first surface by a distance of at most 300 nm.

4. A superconducting device according to claim 2, wherein said insulating film has a thickness of 10 to 50 nanometers.

5. A superconducting device comprising:
a substrate;
a control electrode formed in said substrate such that an upper surface of said control electrode is substantially level with an upper surface of said substrate;
an insulating layer formed over said control electrode;
a semiconductor body formed on said insulating layer so that a first surface of said semiconductor body is adjacent to said insulating layer and so that said control electrode and said semiconductor body are separated from one another by said insulating film; and
a pair of superconducting electrodes formed on a second surface of said semiconductor body to be separated from one another on said second surface, said superconducting electrodes being coupled by a superconducting weak link through said semiconductor body,
wherein said control electrode controls superconducting current flowing through said semiconductor body between said superconducting electrodes, and wherein the thickness of said insulating film is sufficiently great to prevent said superconducting current flowing through said superconducting body from flowing into said control electrode.

6. A superconducting device according to claim 5, wherein said semiconductor body is amorphous silicon.

7. A superconducting device according to claim 5, wherein said semiconductor body is a polycrystalline silicon.

8. A superconducting device according to claim 5, wherein said insulating film has a thickness of 10 to 50 nm.

9. A superconducting device comprising:
a substrate;
a control electrode formed on a first surface of said substrate to protrude from said first surface;
an insulating film formed on said control electrode;
a semiconductor body formed on said insulating film so that a first surface of said semiconductor body is adjacent to said insulating film and so that control electrode and said semiconductor body are separated from one another by said insulating film; and a pair of superconducting electrodes formed on a second surface of said semiconductor body to be separated from one another on said second surface, said superconducting electrodes being coupled by a superconducting weak link through said semiconductor body, wherein said control electrode controls superconducting current flowing through said semiconductor body between said superconducting electrodes, and wherein the thickness of said insulating film is sufficiently great to prevent said superconducting current flowing through said superconducting body from flowing into said control electrode.

10. A superconducting device according to claim 9, wherein said semiconductor body is amorphous silicon.

11. A superconducting device according to claim 9, wherein said insulating film has a thickness of 10 to 50 nm.

12. A superconducting device according to claim 9, wherein said control electrode is formed of a superconducting metal.

13. A superconducting device according to claim 9, wherein said two superconducting electrodes are separated from one another on said first surface by a distance of at most 300 nm.

14. A superconducting device comprising:

a semiconductor body including a first recessed region recessed from a first surface of said semiconductor body to form a thin region of said semiconductor body having a predetermined thickness at said first recessed region;

a pair of superconducting electrodes formed on a second surface of said semiconductor body over said thin region of said semiconductor body to be separated from one another on said second surface, said superconducting electrodes being coupled by a superconducting weak link; and means for controlling the superconducting current flowing through said semiconductor body between said superconducting electrodes, wherein said controlling means is formed adjacent to said first surface of said semiconductor body on said thin region between said superconducting electrodes, and wherein said controlling means is insulated from said semiconductor body so as to prevent said superconducting current flowing through said semiconductor body from flowing into said controlling.

15. A superconducting device according to claim 14, wherein said controlling means comprises a control electrode formed to be separated from said second surface of said semiconductor body by an insulating film.

16. A superconducting device according to claim 14, wherein said two superconducting electrodes are separated from one another on said first surface by a distance of at most 300 nm.

17. A superconducting device according to claim 15, wherein said semiconductor body has a thickness of 100-200 nm at said thin region and said insulating film has a thickness of 10 to 50 nm.

18. A superconducting device according to claim 14, wherein said semiconductor body is single crystal silicon.

19. A superconducting device according to claim 14, wherein said controlling means comprises a control electrode which is formed of a superconducting metal.

20. A superconducting device comprising:

a semiconductor body having a first conductivity type;

a pair of superconducting electrodes formed on a first surface of said semiconductor body to be separated from one another on said first surface, said superconducting electrodes being coupled by a superconducting weak link through said semiconductor body, wherein said pair of superconducting electrodes form Schottky barrier contacts with said semiconductor body; and a control electrode for controlling superconducting current flowing through said semiconductor body between said superconducting electrodes, wherein said control electrode is formed of a semiconductor material having a second conductivity type adjacent to a second surface of said semiconductor body between said superconducting electrodes which is substantially plane, wherein said control electrode forms a pn junction with said semiconductor body.

21. A superconducting device according to claim 20, wherein said two superconducting electrodes are separated from one another on said first surface by a distance of at most 300 nm.

* * * * *